United States Patent
Wampler, II et al.

(10) Patent No.: US 10,589,629 B2
(45) Date of Patent: Mar. 17, 2020

(54) ELECTROCHEMICAL DEVICE SENSOR AND METHOD OF MAKING AND USING THE SAME

(71) Applicant: GM Global Technology Operations LLC, Detroit, MI (US)

(72) Inventors: Charles W. Wampler, II, Birmingham, MI (US); Brian J. Koch, Berkley, MI (US); Mark W. Verbrugge, Troy, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 148 days.

(21) Appl. No.: 15/264,807

(22) Filed: Sep. 14, 2016

(65) Prior Publication Data

US 2018/0072159 A1    Mar. 15, 2018

(51) Int. Cl.
| | |
|---|---|
| *B60L 58/12* | (2019.01) |
| *G01K 11/32* | (2006.01) |
| *B60L 3/00* | (2019.01) |
| *H01M 10/42* | (2006.01) |
| *G01L 1/24* | (2006.01) |
| *G01R 31/36* | (2020.01) |
| *H01M 10/48* | (2006.01) |

(52) U.S. Cl.
CPC ............. *B60L 3/0046* (2013.01); *B60L 58/12* (2019.02); *G01K 11/3206* (2013.01); *G01L 1/246* (2013.01); *G01R 31/3644* (2013.01); *H01M 10/425* (2013.01); *H01M 10/4257* (2013.01); *H01M 10/48* (2013.01); *H01M 10/486* (2013.01); *B60L 2240/545* (2013.01); *B60L 2240/547* (2013.01); *B60L 2240/549* (2013.01); *H01M 2010/4271* (2013.01); *H01M 2010/4278* (2013.01); *H01M 2220/20* (2013.01); *Y02T 10/705* (2013.01); *Y02T 10/7005* (2013.01); *Y02T 10/7044* (2013.01)

(58) Field of Classification Search
None
See application file for complete search history.

(56) References Cited

U.S. PATENT DOCUMENTS

| | | | | |
|---|---|---|---|---|
| 2001/0043330 | A1* | 11/2001 | Jung | G01J 1/06 356/419 |
| 2011/0003279 | A1 | 1/2011 | Patel | |
| 2013/0070235 | A1 | 3/2013 | Chen et al. | |
| 2014/0092375 | A1* | 4/2014 | Raghavan | H01M 10/48 356/32 |
| 2014/0203783 | A1* | 7/2014 | Kiesel | H01M 10/42 320/134 |
| 2014/0222343 | A1* | 8/2014 | Samson | G01V 8/10 702/8 |
| 2015/0069996 | A1* | 3/2015 | Imaoka | G01R 15/22 324/96 |
| 2016/0266265 | A1* | 9/2016 | Kruspe | G01V 1/186 |

* cited by examiner

*Primary Examiner* — Nasima Monsur (57) ABSTRACT

A number of variations may include a product comprising: an electrochemical device comprising an anode and a cathode, and at least one sensor comprising a plurality of strain sensing components and at least one temperature sensing component wherein each of the anode and the cathode comprises at least one strain sensing component comprising an optical fiber comprising at least one grating, wherein the at least one sensor is constructed and arranged to provide measurements that derive both state of charge and temperature of the anode and the cathode simultaneously.

26 Claims, 4 Drawing Sheets

ELECTROCHEMICAL DEVICE SENSOR AND METHOD OF MAKING AND USING THE SAME

TECHNICAL FIELD

The field to which the disclosure generally relates to includes electrochemical device sensors for measuring conditions in electrochemical devices and methods of making and using the same.

BACKGROUND

In a number of variations, electrochemical devices may use an electrochemical device sensor to measure or aid in determining a property of the electrochemical device.

SUMMARY OF ILLUSTRATIVE VARIATIONS

A number of illustrative variations may include a product comprising: an electrochemical device comprising an anode and a cathode, and at least one sensor comprising a plurality of strain sensing components and at least one temperature sensing component wherein each of the anode and the cathode comprises at least one strain sensing component comprising an optical fiber comprising at least one grating, wherein the at least one sensor is constructed and arranged to provide measurements that derive both state of charge and temperature of the anode and the cathode simultaneously.

A number of illustrative variations may include a system comprising: an electrochemical device comprising an anode and a cathode, and at least one sensor comprising a plurality of strain sensing components and at least one temperature sensing component wherein each of the anode and the cathode comprises at least one strain sensing component comprising an optical fiber comprising at least one grating, wherein the at least one sensor is constructed and arranged to provide measurements that derive both state of charge and temperature of the anode and the cathode simultaneously, and a controller operatively connected to the sensor wherein the controller is constructed and arranged to derive at least one of the temperature, state of charge, or state of power of the electrochemical device from at least one of the measurements provided by the sensor.

A number of illustrative variations may include a method comprising: providing an electrochemical device comprising an anode and a cathode, at least one sensor comprising a plurality of strain sensing components and at least one temperature sensing component comprising an optical fiber comprising at least one grating wherein each of the anode and the cathode comprises at least one strain sensing component comprising an optical fiber comprising at least one grating, wherein the at least one sensor is constructed and arranged to provide measurements that derive both state of charge and temperature of the anode and the cathode simultaneously, and a controller operatively connected to the sensor wherein the controller is constructed and arranged to derive at least one of the temperature, state of charge, or state of power of the electrochemical device from at least one of the measurements provided by the sensor; determining the measurements that derive both state of charge and temperature of the electrochemical device through the at least one sensor; transmitting the measurements of the electrochemical device from the at least one sensor to the controller; and deriving at least one of the temperature, state of charge and state of power of the electrochemical device through the controller.

Other illustrative variations within the scope of the invention will become apparent from the detailed description provided hereinafter. It should be understood that the detailed description and specific examples, while disclosing variations within the scope of the invention, are intended for purposes of illustration only and are not intended to limit the scope of the invention.

BRIEF DESCRIPTION OF THE DRAWINGS

Select examples of variations within the scope of the invention will become more fully understood from the detailed description and the accompanying drawings, wherein.

DETAILED DESCRIPTION OF ILLUSTRATIVE VARIATIONS

The following description of the variations is merely illustrative in nature and is in no way intended to limit the scope of the invention, its application, or uses.

Techniques and technologies may be described herein in terms of functional and/or logical block components and various processing steps. It should be appreciated that such block components may be realized by any number of hardware, software, and/or firmware components configured to perform the specified functions. For example, an embodiment of a product, a system or a component may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that variations may be practiced in conjunction with any number of data transmission protocols.

For the sake of brevity, conventional techniques related to hybrid and electric vehicle operation, electrochemical device operation, electrochemical device diagnostics, vehicle computing modules, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a number of variations of the subject matter.

Figure 1:
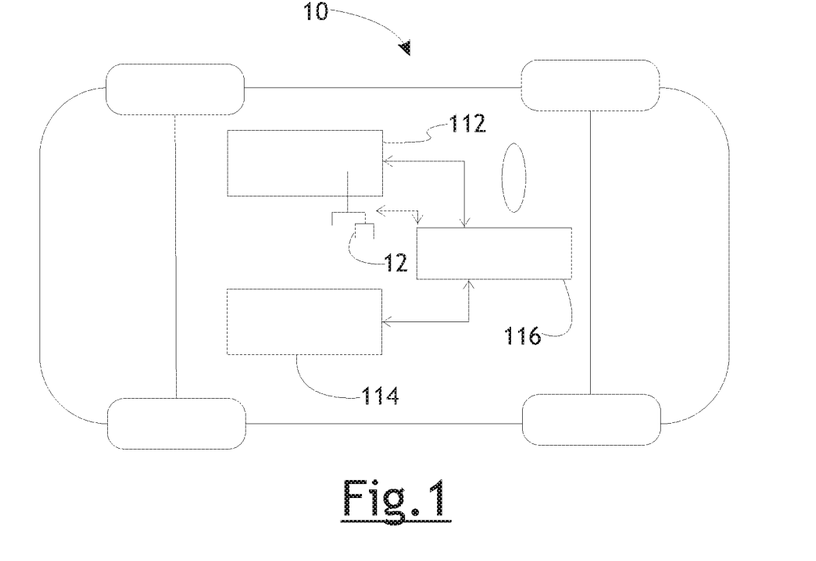
FIG. 1 illustrates a simplified plan view of a product comprising a vehicle including a sensor, an electrochemical device, a controller, and a main power source according to a number of variations.
Figure 4A:
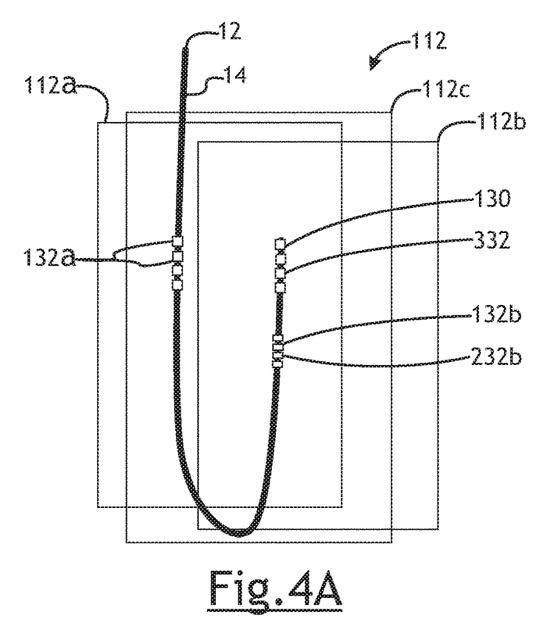
FIG. 4A illustrates a simplified plan view of a product comprising a sensor and an electrochemical device according to a number of variations.
Figure 4B:
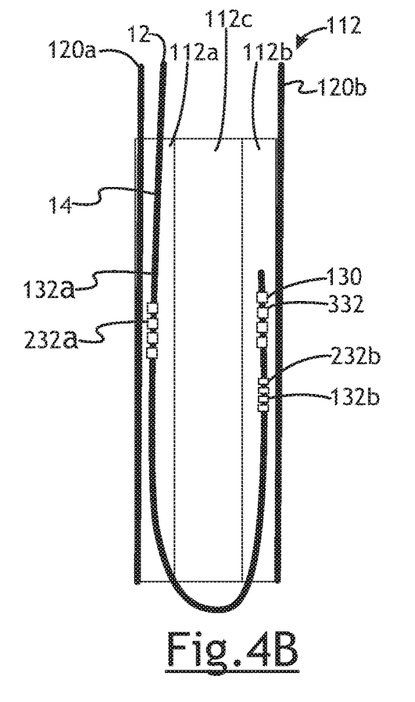
FIG. 4B illustrates a simplified side view of a product comprising a sensor and an electrochemical device according to a number of variations.

FIG. 1 illustrates a product 10 according to a number of variations. In a number of variations, the product 10 may be a vehicle 10, may include a vehicle, or may be a component of a vehicle. In a number of variations, the product 10 may be a vehicle 10, which may be an automobile, motorcycle, spacecraft, watercraft, locomotive, or may be another type. In a number of variations, the vehicle 10 may be an electric vehicle, hybrid vehicle, such as hybrid internal combustion engine vehicles, fuel cell system vehicle, etc. In a number of variations, the product 10 may be any device where an electrochemical device 112 is used or provided including, but not limited to, a appliance, a temperature control unit, a electronic component, a computer based component, or may be another type. In a number of variations, the product 10 may include at least one electrochemical device 112. In a number of variations, the electrochemical device 112 may be a battery, supercapacitor, battery cells, battery packs, hybrid cells (which may include, but are not limited to, supercapacitor electrodes opposite battery electrodes and other mixtures of battery materials and supercapacitor materials, or may be another type) or may be another type. Battery materials may be defined herein as materials that undergo Faradaic (electrochemical) reactions at their surface. Supercapacitor materials may be defined herein as materials that store and release charged ions at their surface but where no Faradaic reaction takes place at their surface. In a number of variations, as illustrated in FIGS. 4A-4B, the electrochemical device may include a cathode 112a. In a number of variations, the electrochemical device may include an anode 112b. In a number of variations, the electrochemical device may include a separator 112c. In a number of variations, the electrochemical device 112 may include a positive current collector 120a. In a number of variations, the electrochemical device 112 may include a negative current collector 120b. In a number of variations, the electrochemical device 112 may include a pouch housing 115. In a number of variations, the product 10 may include a plurality of electrochemical devices 112. In a number of variations, the product 10 may include at least one power source 114. In a number of variations, the product 10 may include a plurality of power sources 114. In a number of variations, the electrochemical device 112 may be a lithium ion electrochemical device, nickel metal hydride (NiMH) electrochemical device, lead acid electrochemical device, lithium polymer electrochemical device, silicon electrochemical device, metal air batteries, or any electrochemical energy storage device wherein the electrode active materials change volume upon operation. In a number of variations, the vehicle 10 may be any electric only vehicle that only employs an electrochemical device 112 as the lone power source. In a number of variations, the electrochemical device 112 is a vehicle battery component.

In a number of variations, the product 10 may include a controller 116 that may be intended to represent all of the control modules and devices necessary for the proper operation and control of the power provided by the electrochemical device 112 and the power source 114 to drive the vehicle 10, recharge the electrochemical device 112 by the power source 114 or regenerative braking, and determine the electrochemical device state of charge (SOC) and state of power (SOP) capability. In a number of variations, the controller 16 may obtain, derive, deduce, monitor, and/or process a set of parameters or conditions associated with electrochemical device 112. These parameters may include, without limitation: current; voltage; SOC; SOP; state of health (SOH); electrochemical device internal resistances; electrochemical device internal reactances; temperature; and power output of the electrochemical device 112. In a number of variations, the controller 116 may be an electrochemical device state estimator. In a number of variations, the product 10 or controller 116 may include an electrochemical device state estimator (BSE).

Figure 2A:
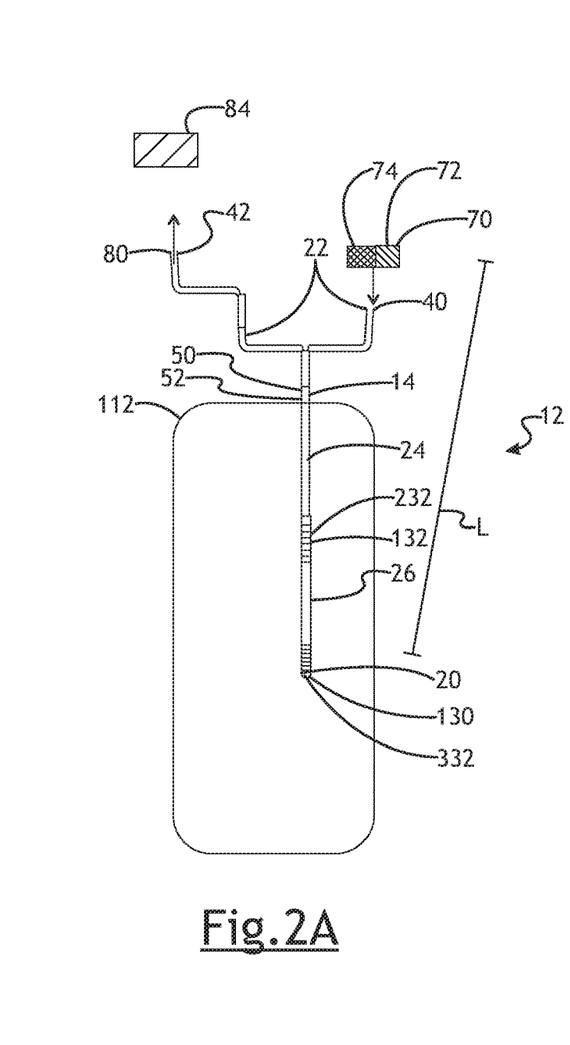
FIG. 2A illustrates a simplified plan view of a product comprising a sensor and an electrochemical device according to a number of variations.
Figure 2B:
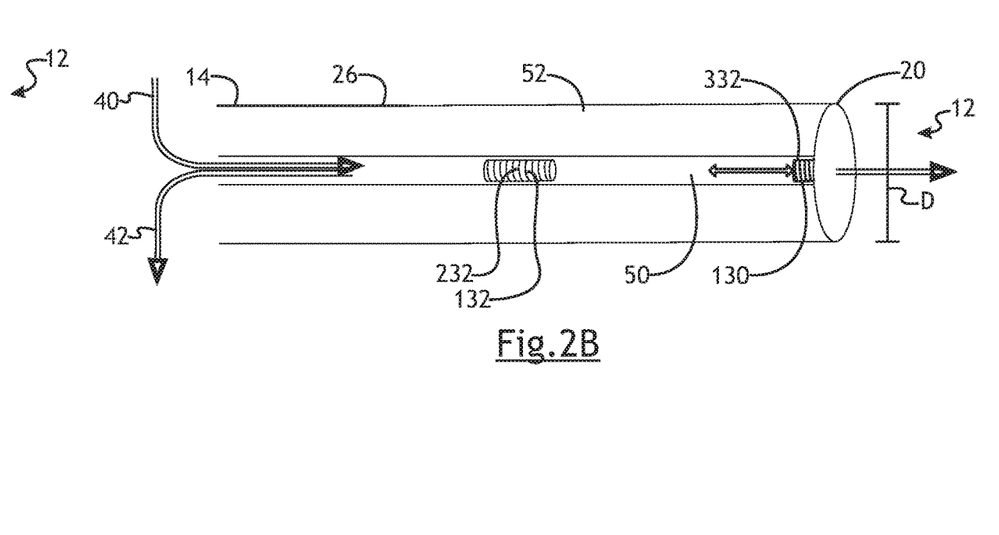
FIG. 2B illustrates a simplified plan view of a product comprising a sensor according to a number of variations.
Figure 3:
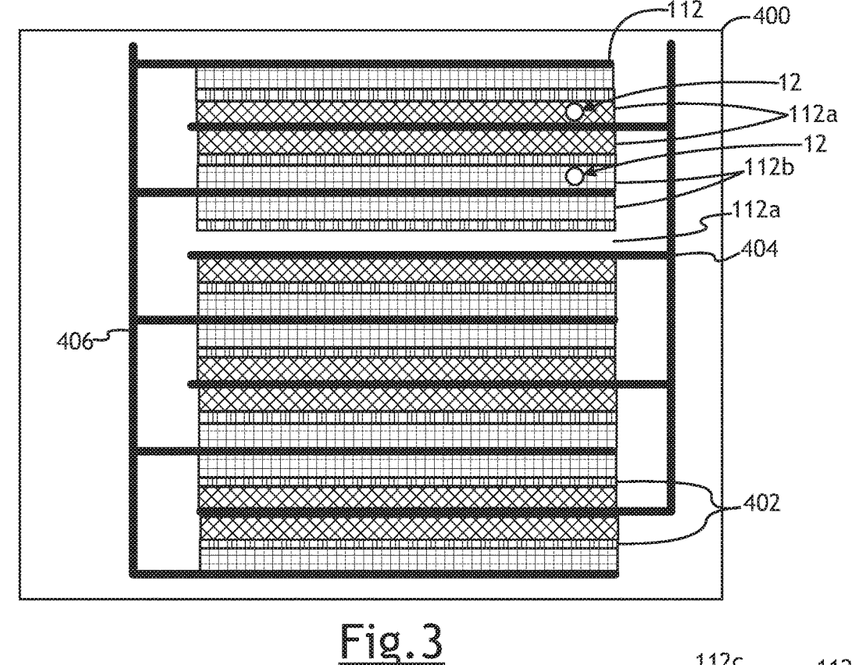
FIG. 3 illustrates a simplified plan view of a product comprising a sensor and an electrochemical device according to a number of variations.

In a number of variations, as shown in FIGS. 2A-4B, the product 10 may include at least one sensor 12. In a number of variations, the product 10 may include a plurality of sensors 12. In a number of variations, the sensor 12 may be in contact with or in close proximity to the electrochemical device 112. In a number of variations, the sensor 12 may be in contact with or in close proximity to the cathode 112a. In a number of variations, the sensor 12 may be in contact with or in close proximity to the anode 112b. In a number of variations, the sensor 12 may be in contact with or in close proximity to the separator 112c. In a number of variations, the sensor 12 may be operatively connected to at least one of the electrochemical device 112, cathode 112a, or anode 112b. In a number of variations, the sensor 12 may monitor and gather measurements of at least one parameter or condition within at least one of the electrochemical device 112, cathode 112a, or anode 112b. In a number of variations, the sensor 12 may be in contact with or in close proximity to the controller 116. In a number of variations, the sensor 12 may be operatively connected to the controller 116. In a number of variations, as shown in FIG. 3, the sensor may be inserted non-parallel or perpendicular to a coil within a cell case 400 of an electrochemical device 112. In a number of variations, the electrochemical device 112 may include at least one separator 402 between the cathode 112a and the anode 112b. In a number of variations, the electrochemical device 112 may include a cathode bus bar 404. In a number of variations, the electrochemical devices 112 may include an anode bus bar 406. In a number of variations, the sensor 12 may transmit the measurements of at least one parameter or condition of at least one of the electrochemical device 112, cathode 112a, or anode 112b to the controller 116. In a number of variations, the sensor 12 may transmit measurements wirelessly or with a wire connection. In a number of variations, the sensor 12 may be constructed and arranged to provide measurements that derive both state of charge and temperature of at least one of the electrochemical device 112, cathode 112a, or anode 112b simultaneously. In a number of variations, the controller 116 may be operatively connected to the at least one sensor 12 wherein the controller 116 may be constructed and arranged to derive at least one of the temperature, the state of charge, or state of power at least one of the electrochemical device 112, cathode 112a, or anode 112b from at least one of the measurements provided by the sensor 12. In a number of variations, the controller 116 may be constructed and arranged to derive at least one of the temperature, the state of charge, or state of power of at least one of the electrochemical device 112, cathode 112a, or anode 112b from at least one of the measurements provided by the sensor 12 simultaneously. In a number of variations, the sensor 12 for the electrochemical device 112 may be dynamically tracked to determine a condition of at least one of the electrochemical device 112, cathode 112a, or anode 112b. The controller 116 may be suitably configured to receive a transmission of the condition of at least one of the electrochemical device 112, cathode 112a, or anode 112b from the sensor 12. The controller 116 may use this information to control the operation of the product 10 or at least one of the electrochemical device 112, cathode 112a, or anode 112b.

In a number of variations, the controller 116 may comprise any type of control module or vehicle controller known in the art, and can be equipped with nonvolatile memory, random access memory (RAM), discrete and analog input/output (I/O), a central processing unit, and/or communications interfaces for networking within an automotive communications network. In a number of variations the controller 116 and possibly other illustrative blocks, modules, processing logic, and circuits described in connection with the embodiments disclosed herein may be implemented or performed with a general purpose processor, a content addressable memory, a digital signal processor, an application specific integrated circuit, a field programmable gate array, any suitable programmable logic device, discrete gate or transistor logic, discrete hardware components, or any combination thereof, designed to perform the functions described herein. A processor may be realized as a microprocessor, a controller, a microcontroller, or a state machine. A processor may also be implemented as a combination of computing devices, e.g., a combination of a digital signal processor and a microprocessor, a plurality of microprocessors, one or more microprocessors in conjunction with a digital signal processor core, or any other such configuration. Moreover, the steps of a method or algorithm described in connection with the variations disclosed herein may be embodied directly in hardware, in firmware, in a software module executed by a processor, or in any practical combination thereof. In a number of variations, a software module may reside in RAM memory, flash memory, ROM memory, EPROM memory, EEPROM memory, registers, a hard disk, a removable disk, a CD-ROM, or any other form of storage medium known in the art. In this regard, an exemplary storage medium may be coupled to a processor such that the processor can read information from, and write information to, the storage medium. In a number of variations, the storage medium may be integral to the processor.

In a number of variations, the subject matter and certain aspects of the embodiments thereof may be described in the general context of computer-executable instructions, such as program modules, executed by one or more computing modules, controllers, or other devices. In a number of variations, program modules may include routines, programs, objects, components, data structures, and/or other elements that perform particular tasks or implement particular abstract data types. In a number of variations, the functionality of the program modules may be combined or distributed as desired in various variations. In a number of variations, a computing device that performs computer-executable instructions may include at least some form of computer readable media. Computer readable media may be any available media that can be accessed by a computing device and/or by applications executed by a computing device.

In a number of variations, as shown in FIGS. 2A-2B, the at least one sensor 12 may include a fiber 14. In a number of variations, the sensor 12 may include an optical fiber 14. In a number of variations, the fiber 14 may include a first end 20, a second end 22 and a longitudinal midsection 24 of length L. In a number of variations, the fiber 14 may have a radial edge 26. In a number of variations, as shown in FIG. 2B, the fiber 14 may have a core 50. In a number of variations, as shown in FIG. 2B, the fiber 14 may have a cladding 52. In a number of variations, the fiber 14 may have a cross-sectional shape comprising at least one of a circle, an oval, an ellipse, a polygon, or may be another shape. In a number of variations, the fiber 14 may have a cross-sectional diameter or width D. In a number of variations, the fiber 14 may be hollow. In a number of variations, the fiber 14 may include a hollow section or core 50 and may include a solid section or cladding 52 along its longitudinal midsection 24. In a number of variations, the first end 20 may be open or closed. In a number of variations, the second end 22 may be open or closed. In a number of variations, the fiber may be made of a material including, but not limited to, silica, plastic, fluoride glass (such as, but not limited to, phosphorus pentoxide, or may be another type), phosphate glass (such as, but not limited to, HMFG, ZBLAN glass, or may be another type), fluorozirconate, fluoroaluminate, chalcogenide glasses, crystalline materials, sapphire, fiberglass, combinations thereof or may be another material. In a number of variations, the fiber 14 may be doped with a doping material comprising at least one of germanium dioxide, aluminium oxide, fluorine, boron trioxide, aluminosilicate, germanosilicate, phosphosilicate, borosilicate glass, combinations thereof or may be another material. In a number of variations, the fiber 14 may be formed or manufactured through any known method including, but not limited to, drawing, preforming, or may be another type. In a number of variations, the fiber 14 may be a single mode fiber. In a number of variations, the fiber 14 may be a multi-mode fiber.

In a number of variations, as shown in FIGS. 2A-2B and 4, the product 10, sensor 12, longitudinal midsection 24, or first end 20 of the fiber 14 may include a temperature sensing component 130. In a number of variations, as shown in FIGS. 2A-2B, the temperature sensing component 130 may include at least one grating 332. In a number of variations, the grating 332 may be at the first end 20 of the fiber 14. In a number of variations, the grating 332 may be at the first end 20 of the fiber 14. In a number of variations, the grating 332 may be at the second end 22 of the fiber 14. In a number of variations, the grating 332 may be placed anywhere along the longitudinal midsection 24 of the fiber 14. In a number of variations, the grating 332 may be at a radial edge 26 of the fiber 14. In a number of variations, the grating 332 may be placed in the core 50 of the fiber 50. In a number of variations, the grating 332 may be placed in the cladding 52 of the fiber 14. In a number of variations, the grating 332 may be a Fiber Bragg grating or a Bragg grating. In a number of variations, the grating 332 may be a standard grating (including but not limited to a type I grating, a type IA grating, a type IIA grating, or may be another type), a generated grating (including but not limited to a type II grating, or may be another type). In a number of variations, the grating 332 may be a uniform fiber Bragg grating, a chirped fiber Bragg grating, a tilted fiber Bragg grating, a superstructure fiber Bragg grating, an apodized grating, a period grating, or may be another type. In a number of variations, the grating 332 may be inscribed within the core 50 of the fiber 14. In a number of variations, temperature sensing component 30 may close the first end 20 of the fiber 14. In a number of variations, the temperature sensing component 130 may be a grating on at least a portion of the first end 14 of the fiber 14. In a number of variations, the temperature sensing component 130 may be a coating that may cover or leave open the first end 20 of the fiber 14. In a number of variations, the temperature sensing component 130 may cover at least one of the core 50 or cladding 52 of the fiber 14.

In a number of variations, as shown in FIGS. 2A-2B and 4A-4B, the product 10, sensor 12, longitudinal midsection 24, or first end 20 of the fiber 14 may include at least one strain sensing component 132. In a number of variations, as shown in FIGS. 2A-2B and 4, the strain sensing component 132 may include at least one grating 232. In a number of variations, the grating 232 may be at the first end 20 of the fiber 14. In a number of variations, the grating 232 may be at the second end 22 of the fiber 14. In a number of variations, the grating 232 may be placed anywhere along the longitudinal midsection 24 of the fiber 14. In a number of variations, the grating 232 may be at a radial edge 26 of the fiber 14. In a number of variations, the grating 232 may be placed in the core 50 of the fiber 50. In a number of variations, the grating 232 may be placed in the cladding 52 of the fiber 14. In a number of variations, the grating 232 may be a Fiber Bragg grating or a Bragg grating. In a number of variations, the grating 232 may be a standard grating (including but not limited to a type I grating, a type IA grating, a type IIA grating, or may be another type), a generated grating (including but not limited to a type II grating, or may be another type). In a number of variations, the grating 232 may be a uniform fiber Bragg grating, a chirped fiber Bragg grating, a tilted fiber Bragg grating, a superstructure fiber Bragg grating, an apodized grating, a period grating, or may be another type. In a number of variations, the grating 232 may be inscribed within the core 50 of the fiber 14.

In a number of variations, as shown in FIG. 2A, the fiber 14 may have a second end 22. In a number of variations, the second end 22 may have an input port 40 and an output port 42. In a number of variations, the input port 40 may include an input hybrid light source 70. In a number of variations, the input hybrid light source may include a narrow band light source 72 and a wide band input light source 74. In a number of variations, the output port 42 may include a first output port path 80 and a second output port path 82. In a number of variations, the first output port path 80 may include at least one spectrometer 84. In a number of variations, the spectrometer 84 may be constructed and arranged or capable of measuring wavelength shift of the wide band light or the narrow band light from at least one of the temperature sensing component 130 grating 230 or the strain sensing component 132 grating 232 of the sensor 12.

In a number of variations, as shown in FIG. 2A, the sensor 12 may be placed in contact with the electrochemical device 112. In a number of variations, the sensor 12 may be placed within the electrochemical device 112 itself. In a number of variations, the sensor 12 may be placed within the cathode 112a. In a number of variations, the sensor 12 may be placed within the anode 112b. In a number of variations, the sensor 12 may be placed within both the cathode 112a and the anode 112b. In a number of variations, the sensor 12 may include at least one grating 32, 232, 332 in both the anode 112b and the cathode 112a. In a number of variations, the strain sensing component 132 or grating 232 may be placed within the cathode 112a. In a number of variations, the strain sensing component 132 or grating 232 may be placed within the anode 112b. In a number of variations, a strain sensing component 132 or grating 232 may be placed within both the cathode 112a and the anode 112b. In a number of variations, the strain temperature sensing component 130 or grating 332 may be placed within the cathode 112a. In a number of variations, the temperature sensing component 130 or grating 332 may be placed within the anode 112b. In a number of variations, a temperature sensing component 130 or grating 332 may be placed within both the cathode 112a and the anode 112b. In a number of variations, one temperature sensing component 130 or grating 332 may be placed in the anode 112a or cathode 112b at a similar distance within the electrochemical device 112. In a number of variations, the sensor 12 may be placed between, next to, or within a separator 112c within the electrochemical device 112. In a number of variations, the sensor 12 may send both narrow band light from the narrow band light source 72 and wide band light from the wide band light source 74 through the input port 50 and into the longitudinal midsection 26. In a number of variations, the hybrid light may reach the first end 20 of the sensor 12. In a number of variations, the hybrid light may reach the output port 42 of the sensor 12 and exit the sensor at the first output port path 80 and be measured in the spectrometer 84. In a number of variations, the gratings 232 of the strain sensing component 132 may shift the wavelength of the light through the sensor 12. In a number of variations, the gratings 332 of the temperature sensing component 130 may shift the wavelength of the light through the sensor 12, which may be offset or shielded from the wavelength measurement of the strain sensing component 132. In a number of variations, the hybrid light, narrow band light, or wide band light may be reflected in the grating 332, 232 of the temperature sensing component 130 and/or the strain sensing component 132 such that the wavelength of the light may be shifted and the resulting wavelength shift may be measured through the spectrometer 84. In a number of variations, the narrow band light or wide band light may be compatible with the temperature sensing component 132 to provide a measured power output as a function of time, which may be measured by a narrow band path detector. In a number of variations, the spectrometer may take wavelength shifts of both the temperature sensing component 130 and the strain sensing component 132 to provide wavelength shift at various locations in the cathode 112a and anode 112b. In a number of variations, the sensor 12 may transmit or feed values for wavelength shift and power output to the controller 116. In a number of variations, the controller 116 may determine the strain and temperature of the electrochemical device 112 from these values. In a number of variations, the power as a function of time may be used to determine the temperature and the change in wavelength and temperature can be used to determine the strain.

In a number of variations, the strain and temperature determined in the controller 116 form the measurements provided by the sensor 12 may be correlated from the wavelength shift of the narrow band light or wide band light through the use of a look-up table measuring wavelength shift versus temperature values or strain values. In a number of variations, the strain and temperature determined in the controller 116 from the measurements provided by the sensor 12 may be fed into a temperature compensated state of charge look-up table to determine a first state of charge of the electrochemical device 112 $SOC_1$. In a number of variations, $SOC_1$ may be formulated from a calibrated relationship between strain and state of charge of the electrochemical device 112. In a number of variations, the controller 116 or sensor 12 may also measure at least one of current $I_m$ or voltage $V_m$ of the electrochemical device 112. In a number of variations, the temperature and measured current and voltage may be fed into a battery equivalent circuit model (ECM) used to determine a second state of charge of the electrochemical device 112 $SOC_2$. In a number of variations, $SOC_2$ may be formulated from coulomb counting of the electrochemical device 112. In a number of variations, the ECM may also determine a predicted current $I_p$ and/or voltage $V_p$ for the electrochemical device 112. In a number of variations, the predicted current $I_p$ and voltage $V_p$ and the state of charge $SOC_2$ from the battery equivalent circuit model (ECM) may be fed along with the measured current $I_m$ and voltage $V_m$ and the determined state of charge $SOC_1$ from the lookup table into a Kalman Filter estimator which compares the measured current $I_m$, voltage $V_m$, & $SOC_1$ from the look-up table provided by the sensor and compares to the corresponding values for predicted current $I_p$, voltage $V_p$, and the state of charge $SOC_2$ from the battery equivalent circuit model (ECM) and computes corrected parameters and full state estimates of parameters for the electrochemical device 112, which may be fed in a feedback loop to the battery equivalent circuit model. In a number of variations, these Kalman filter estimator may determine a corrected $SOC_3$ which may be used to determine an estimated state of power (SOP) for the electrochemical device through use of a state of power estimator. In a number of variations, the corrected state of charge $SOC_3$ and state of power SOP may be used to provide corrected parameters for the battery equivalent circuit model (ECM) in a feedback loop. In a number of variations, the state of charge $SOC_3$ and state of power SOP may be feed into a battery management system (BSM) to provide a commanded current or voltage to the battery equivalent circuit model (ECM), the sensor 12, and/or the electrochemical device 112. In a number of variations, the battery state estimator (BSE) may include all of these components (including, but not limited to, the electrochemical device 112, sensor 12, battery equivalent circuit model (ECM), Kalman Filter Estimator, State of Power Estimator, and/or Battery Management System) and all of these components may be present in the controller 116. In a number of variations, values for predicted voltage $V_p$, predicted current $I_p$, predicted state of charge $SOC_1$, $SOC_2$, $SOC_3$, state of power SOP, or a number of values may be processed using any number of linear regression methods which may include but are not limited to the use of a Kalman filter, WRLS analysis, or any other method known in the art. In such variations, the equivalent circuit may be constructed to operate in a manner approximating the processed data.

Figure 5A:
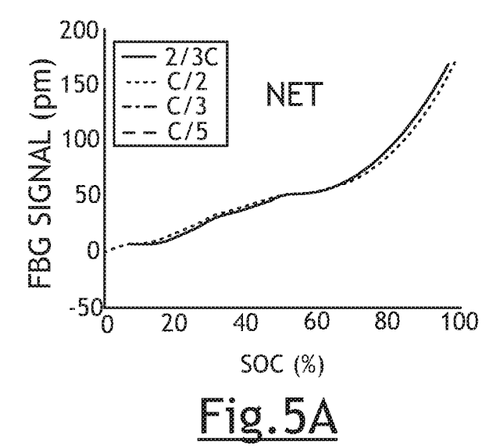
FIG. 5A illustrates a graph of the function of strain via grating shift vs. state of charge for an electrochemical device according to a number of variations.
Figure 5B:
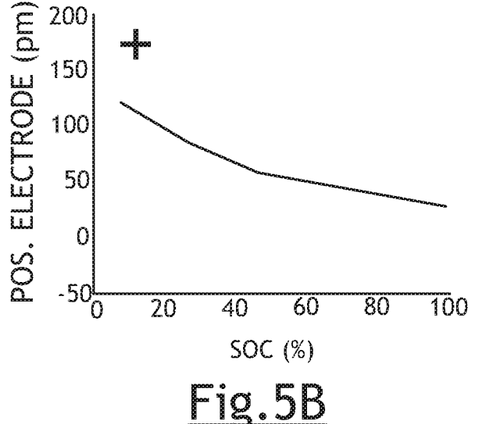
FIG. 5B illustrates a graph of the function of strain via grating shift vs. state of charge for an electrochemical device according to a number of variations.
Figure 5C:
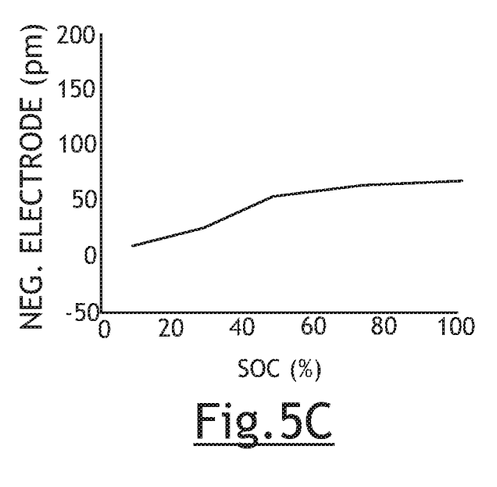
FIG. 5C illustrates a graph of the function of strain via grating shift vs. state of charge for an electrochemical device according to a number of variations.

In a number of variations, the gratings 32, 232 of the at least one strain sensing component 132 may be used to indicate expansion and contraction that occurs when intercalation electrodes at the cathode 112a and anode 112b are charged and discharged, this measurement may be correlated to the state of charge of the electrochemical device 112 to measure this condition of the electrochemical device. This may be done by changes in the wavelength of reflection of hybrid light through the grating 232, 332 which is correlated to a look up table to measure strain. In a number of variations, the correlation between strain and state of charge of the electrochemical device may be a 1 to 1 correlation, as shown in FIG. 5A. In a number of variations, strain at each of the cathode 112a and the anode 112b can give a better indicator of state of power (as shown in FIGS. 5A-5C) as due to imperfect mechanical isolation. Both the anode strain sensor 132b and the cathode strain sensor 132a may measure local net strain through the use of their gratings 232b, 232a, which they do at a different proportion, allowing disambiguation of the state of charge signal from the sensor 12 to the controller 116. In a number of variations, the measured electrode strains of the cathode 112a and anode 112b work in opposition to one another as during charge the negative anode 112b would expand and the positive cathode 112a would contract and vice versa during discharge. This may resolve state of charge and strain measurements for the electrochemical device 112 through measurement and correlation of this relationship at a constant temperature. However, in a number of variations, shifts in strain curves can be made when temperature is not constant. Therefore, measurement of temperature through the temperature sensor 130 and the temperature sensor grating 332 may account for the change in the curve of the strain sensor measurements through a mathematic look up table within the controller 116 accounting for strain at a given temperature. In this way, state of charge of the electrochemical device 112 may be found across all temperatures.

In a number of variations, the sensor 12 or system may provide a better measurement of electrochemical device 112 parameters such as state of charge, temperature, or state of power. In a number of variations, this may be done at higher and lower temperatures with improved accuracy. In a number of variations, one may avoid problems with accurately displaying these conditions due to hysteresis or when open-circuit voltage is flat with the use of the sensor 12 or system. In a number of variations, this may improve the safety protection and/or warranty for the electrochemical device 112. Accurate knowledge of internal electrochemical device parameters may be important for purposes of controlling the electrochemical device systems of hybrid electric (and purely electric) vehicles. The methodology described herein adaptively extracts measurements and/or estimations of the internal parameters for electrochemical devices 112. The advantages of the proposed methodology over existing techniques are better adaptation to variations in the environment, electrochemical device state, and driving conditions, higher computational efficiency, and lower implementation cost including but not limited to, more accurate power prediction models for better power management in the electrochemical device 112 and the product 10 through the controller 116. In a number of variations, this new methodology may provide better power prediction for better power management in an electrochemical device 112 which may benefit range, performance and life of the electrochemical device 112.

In a number of variations, a system may be provided. In a number of variations, the system may include an electrochemical device 112. In a number of variations, the system could include at least one sensor 12 contacting or in close proximity to the electrochemical device 112. In a number of variations, the sensor 12 may be operatively connected to the electrochemical device 112. In a number of variations, the sensor 12 may include an optical fiber 14 comprising a first end 20 comprising a semiconductor material 30. In a number of variations, the sensor 12 may include a second end 22. In a number of variations, the sensor may include a longitudinal midsection 24 comprising a grating 32. In a number of variations, the sensor 12 may be constructed and arranged to provide measurements that derive both state of charge and temperature of an electrochemical device 112 simultaneously. In a number of variations, the system may further include a controller 116. In a number of variations, the controller 116 may be constructed and arranged to derive at least one of the temperature, state of charge, or state of power of the electrochemical 116 device from at least one of the measurements provided by the sensor 112.

In a number of variations, a method is shown. In a number of variations, the method may include a step of providing an electrochemical device 112, at least one sensor 12 contacting or in close proximity to an electrochemical device 112, the sensor 12 comprising an optical fiber 14 comprising a first end 20 comprising a semiconductor material 30, a second end 22, and a longitudinal midsection 24 comprising a grating 32, wherein the sensor 12 is constructed and arranged to provide measurements that derive both state of charge and temperature of an electrochemical device 112 simultaneously, and a controller 116 operatively connected to the sensor 12 wherein the controller 116 is constructed and arranged to derive at least one of the temperature, state of charge, or state of power of the electrochemical device 112 from at least one of the measurements provided by the sensor 12. In a number of variations, the method may include a step of determining the measurements that derive both state of charge and temperature of the electrochemical device 112 through the sensor 12. In a number of variations, the method may include a step of transmitting the measurements of the electrochemical device 112 from the sensor 12 to the controller 116. In a number of variations, the method may include a step of deriving at least one of the temperature, state of charge and state of power of the electrochemical device 112 through the controller 116.

The following description of variants is only illustrative of components, elements, acts, product and methods considered to be within the scope of the invention and are not in any way intended to limit such scope by what is specifically disclosed or not expressly set forth. The components, elements, acts, product and methods as described herein may be combined and rearranged other than as expressly described herein and still are considered to be within the scope of the invention.

Variation 1 may include a product comprising: an electrochemical device comprising an anode and a cathode, and at least one sensor comprising a plurality of strain sensing components and at least one temperature sensing component wherein each of the anode and the cathode comprises at least one strain sensing component comprising an optical fiber comprising at least one grating, wherein the at least one sensor is constructed and arranged to provide measurements that derive both state of charge and temperature of the anode and the cathode simultaneously.

Variation 2 may include a product as set forth in Variation 1 wherein the temperature sensing component comprises an optical fiber comprising at least one grating.

Variation 3 may include a product as set forth in any of Variations 1-2 wherein the at least one grating comprises a Fiber Bragg grating.

Variation 4 may include a product as set forth in any of Variations 1-3 wherein the sensor comprises a first end, a second and longitudinal midsection and wherein the second end comprises an input port and an output port.

Variation 5 may include a product as set forth in Variation 4 wherein the input port comprises an input hybrid light source comprising a narrow band light source and a wide band light source.

Variation 6 may include a product as set forth in any of Variations 4-5 wherein the output port comprises a first output port path detector comprising a spectrometer capable of measuring wavelength shift of the wide band or narrow band light from the at least one grating of the strain sensing component.

Variation 7 may include a product as set forth in any of Variations 4-6 wherein the output port comprises a first output port path detector comprising a spectrometer capable of measuring wavelength shift of the wide band or narrow band light from at least one grating of the temperature sensing component.

Variation 8 may include a product as set forth in any of Variations 1-7 wherein the product further comprises a controller operatively connected to the sensor wherein the controller is constructed and arranged to derive at least one of the temperature, the state of charge, or state of power of the electrochemical device from at least one of the measurements provided by the sensor.

Variation 9 may include a product as set forth in any of Variations 1-8 wherein the sensor provides a strain measurement on the cathode and the anode that is correlated to state of charge of the cathode, anode, or electrochemical device.

Variation 10 may include a system comprising: an electrochemical device comprising an anode and a cathode, and at least one sensor comprising a plurality of strain sensing components and at least one temperature sensing component wherein each of the anode and the cathode comprises at least one strain sensing component comprising an optical fiber comprising at least one grating, wherein the at least one sensor is constructed and arranged to provide measurements that derive both state of charge and temperature of the anode and the cathode simultaneously, and a controller operatively connected to the sensor wherein the controller is constructed and arranged to derive at least one of the temperature, state of charge, or state of power of the electrochemical device from at least one of the measurements provided by the sensor.

Variation 11 may include a method comprising: providing an electrochemical device comprising an anode and a cathode, at least one sensor comprising a plurality of strain sensing components and at least one temperature sensing component comprising an optical fiber comprising at least one grating wherein each of the anode and the cathode comprises at least one strain sensing component comprising an optical fiber comprising at least one grating, wherein the at least one sensor is constructed and arranged to provide measurements that derive both state of charge and temperature of the anode and the cathode simultaneously, and a controller operatively connected to the sensor wherein the controller is constructed and arranged to derive at least one of the temperature, state of charge, or state of power of the electrochemical device from at least one of the measurements provided by the sensor; determining the measurements that derive both state of charge and temperature of the electrochemical device through the at least one sensor; transmitting the measurements of the electrochemical device from the at least one sensor to the controller; and deriving at least one of the temperature, state of charge and state of power of the electrochemical device through the controller.

Variation 12 may include a method as set forth in Variation 11 wherein the at least one sensor comprises a first end, a second and longitudinal midsection and wherein the second end comprises an input port and an output port.

Variation 13 may include a method as set forth in any of Variations 11-12 wherein the input port comprises an input hybrid light source comprising a narrow band light source and a wide band light source.

Variation 14 may include a method as set forth in Variation 13 wherein the output port comprises at least one of a first output port path detector comprising a spectrometer capable of measuring wavelength shift of the wide band or narrow band light of the at least one grating of the strain sensing component.

Variation 15 may include a method as set forth in any of Variations 13-14 wherein the output port comprises at least one of a first output port path detector comprising a spectrometer capable of measuring wavelength shift of the wide band or narrow band light of the at least one grating of the temperature sensing component.

Variation 16 may include a method as set forth in any of Variations 14-15 wherein the controller derives the state of charge of at least one of the cathode, the anode, or the electrochemical device at the first end of the sensor from at least one of the measurement of wavelength shift of the wade band or narrow light at the grating of the strain sensing component.

Variation 17 may include a method as set forth in any of Variations 11-16 wherein the controller derives the temperature of the electrochemical device at the first end of the sensor from at least one of the measurement of wavelength shift of the wade band or narrow light at the grating of the temperature sensing component.

Variation 18 may include a method as set forth in Variation 17 wherein at least one of the sensor or controller also measures the voltage and current of the electrochemical device.

Variation 19 may include a method as set forth in Variation 18 wherein the controller derives the state of charge of the electrochemical device from at least one of the measured voltage, current, derived temperature and derived strain.

Variation 20 may include a method as set forth in any of Variations 11-19 wherein the controller predicts the state of power of the electrochemical device from the state of charge and derived temperature.

The above description of select variations within the scope of the invention is merely illustrative in nature and, thus, variations or variants thereof are not to be regarded as a departure from the spirit and scope of the invention.

What is claimed is:

1. A product comprising:
an electrochemical device comprising:
an anode;
a cathode; and
at least one sensor comprising:
a plurality of strain sensing components; and
at least one temperature sensing component, wherein the plurality of strain sensing components include:
a first strain sensing component disposed within the cathode; and
a second strain sensing component disposed within the anode;
wherein the plurality of strain sensing components each include an optical fiber comprising at least one grating,
wherein the first and second strain sensing components are constructed and arranged to provide measurements of local net strain using their gratings,
wherein the at least one temperature sensing component is constructed and arranged to measure a temperature, and
wherein the first and second strain sensing components are constructed and arranged to allow for disambiguation of state of charge signal by a controller through the use of their gratings, and wherein
the optical fiber comprises a first end, a second end, and a longitudinal midsection, wherein the second end comprises an input port and an output port; and wherein
the optical fiber includes a hollow section and a solid section along its longitudinal midsection.

2. A product as set forth in claim 1, wherein the temperature sensing component comprises the optical fiber comprising at least one grating.

3. A product as set forth in claim 1, wherein the first and second strain sensing components include Fiber Bragg gratings.

4. A product as set forth in claim 1, wherein the input port comprises an input hybrid light source comprising a narrow band light source and a wide band light source.

5. A product as set forth in claim 4, wherein the output port comprises a first output port path detector comprising a spectrometer capable of measuring wavelength shift of a wide band or narrow band light from the gratings of the first and second strain sensing components.

6. A product as set forth in claim 4, wherein the output port comprises a first output port path detector comprising a spectrometer capable of measuring wavelength shift of a wide band or narrow band light from at least one grating of the temperature sensing component.

7. A product as set forth in claim 1, wherein the controller operatively connected to the at least one sensor wherein the controller is constructed and arranged to derive at least one of the temperature, the state of charge, or state of power of the electrochemical device from at least one of the measurements provided by the at least one sensor.

8. A product as set forth in claim 5, wherein the sensor provides a strain measurement on the cathode and the anode that is correlated to the state of charge of the cathode, anode, or electrochemical device.

9. The product as set forth in claim 1, wherein the sensor, the strain sensing component and the temperature sensing component are all implemented within a single optical fiber.

10. The product as set forth in claim 1, wherein a single separator is interposed between the cathode and anode.

11. The product as set forth in claim 1, wherein the first strain sensing component of the cathode is not at an opposite end of the electrochemical device from the second at least one strain sensing component of the anode.

12. A system comprising: an electrochemical device comprising;
an anode; and
a cathode;
at least one sensor comprising a plurality of strain sensing components and
at least one temperature sensing component,
wherein the plurality of strain sensing components include:
a first strain sensing component disposed within the cathode; and
a second strain sensing component disposed within the anode; wherein
the plurality of strain sensing components each include an optical fiber comprising at least one grating, wherein
the optical fiber includes a hollow section and a solid section along its longitudinal midsection;
wherein the first and second strain sensing components are constructed and arranged to provide measurements of local net strain using their gratings, and
wherein the at least one temperature sensing component is constructed and arranged to measure temperature; and
a controller operatively connected to the sensor, wherein the controller is constructed and arranged to derive at least one of the temperature, state of charge, or state of power of the electrochemical device from at least one of the measurements provided by the sensor, and wherein
the first and second strain sensing components are constructed and arranged to allow for disambiguation of a state of charge by the controller from the at least one sensor.

13. The system as set forth in claim 12, wherein the sensor comprises a first end, a second end, and a longitudinal midsection and wherein the second end comprises an input port and an output port.

14. The system as set forth in claim 12, wherein a single separator engages both the cathode and anode.

15. The system as set forth in claim 12, wherein the first at least one strain sensing component of the cathode is not at an opposite end of the electrochemical device from the second strain sensing component of the anode.

16. A method comprising:
providing an electrochemical device comprising an anode and a cathode, at least one sensor comprising a plurality of strain sensing components and
at least one temperature sensing component,
wherein the plurality of strain sensing components include:
a first strain sensing component disposed within the cathode; and
a second strain sensing component disposed within the anode; wherein
the plurality of strain sensing components each include an optical fiber comprising at least one grating,
wherein the first and second strain sensing components are constructed and arranged to provide measurements of local net strain using their gratings,
wherein the at least one temperature sensing component is constructed and arranged to measure a temperature of the electrochemical device; and
wherein the at least one sensor is constructed and arranged to provide measurements that derive both state of charge and temperature of the anode and the cathode simultaneously;
transmitting the measurements of the electrochemical device from the at least one sensor to a controller; and
by the controller, deriving at least one of the temperature and the state of charge of the electrochemical device from the measurements provided by the sensor,
wherein the optical fiber comprises a first end, a second end, and a longitudinal midsection and wherein the second end comprises an input port and an output port, wherein
the optical fiber includes a hollow section and a solid section along its longitudinal midsection; and
wherein the first and second strain sensing components are constructed and arranged to allow for disambiguation of a state of charge by the controller through the use of their gratings.

17. A method as set forth in claim 16, wherein the input port comprises an input hybrid light source comprising a narrow band light source constructed and arranged to produce a narrow band light and a wide band light source constructed and arranged to produce a wide band light.

18. A method as set forth in claim 17, wherein the output port comprises at least one of a first output port path detector comprising a spectrometer configured to measure wavelength shift of a wide band light or the narrow band light of the gratings of the first and second strain sensing components.

19. A method as set forth in claim 17, wherein the output port comprises at least one of a first output port path detector comprising a spectrometer configured to measure wavelength shift of a wide band light or narrow band light of the at least one grating of the temperature sensing component.

20. The method as set forth in claim 19, wherein the controller derives the state of charge from at least one of the measurement of wavelength shift of the wide band light or narrow band light at the gratings of the first and second strain sensing component.

21. The method as set forth in claim 19, wherein the controller derives the temperature of the electrochemical device at the first end of the sensor from at least one of the measurement of wavelength shift of the wide band light or narrow band light at the at least one grating of the temperature sensing component.

22. The method as set forth in claim 20, wherein at least one of the sensor or controller also measures voltage and current of the electrochemical device.

23. The method as set forth in claim 21, wherein the controller derives the state of charge of the electrochemical device from at least one of the measured voltage, current, derived temperature and derived strain.

24. The method as set forth in claim 22, wherein the controller further predicts a state of power of the electrochemical device from the state of charge and derived temperature.

25. The method as set forth in claim 16, wherein a single separator engages both the cathode and anode.

26. The method as set forth in claim 16, wherein the first strain sensing component of the cathode is not at an opposite end of the electrochemical device from the second strain sensing component of the anode.

* * * * *